(12) United States Patent
Siminoff et al.

(10) Patent No.: US 10,797,455 B2
(45) Date of Patent: Oct. 6, 2020

(54) MOUNTING ASSEMBLY FOR AN ELECTRICALLY-POWERED DEVICE

(71) Applicant: AMAZON TECHNOLOGIES, INC., Seattle, WA (US)

(72) Inventors: James Siminoff, Pacific Palisades, CA (US); Mark Siminoff, Mountain View, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/394,365

(22) Filed: Apr. 25, 2019

(65) Prior Publication Data

US 2019/0252840 A1    Aug. 15, 2019

Related U.S. Application Data

(63) Continuation of application No. 15/954,448, filed on Apr. 16, 2018, now Pat. No. 10,312,652.

(Continued)

(51) Int. Cl.
*H01R 33/94* (2006.01)
*H01R 12/70* (2011.01)
(Continued)

(52) U.S. Cl.
CPC ......... *H01R 33/94* (2013.01); *H01R 12/7088* (2013.01); *H01R 13/622* (2013.01);
(Continued)

(58) Field of Classification Search
CPC ................ H01R 33/94; H01R 33/9456; H01R 13/6397; H01R 13/622; H01R 33/971;
(Continued)

(56) References Cited

U.S. PATENT DOCUMENTS 4,590,339 A * 5/1986 Scott-Jackson .... G05G 9/04788
200/6 A
6,124,886 A * 9/2000 DeLine ................ B60Q 1/2665
348/148

(Continued)

OTHER PUBLICATIONS

International Search Report and Written Opinion of PCT/US2018/027807 dated Aug. 3, 2018, 14 pp.

(Continued)

*Primary Examiner* — Truc T Nguyen
(74) *Attorney, Agent, or Firm* — Lathrop GPM LLP (57) ABSTRACT

A mounting assembly for electro-mechanically connecting an electrically-powered device to a structure includes a housing, a first printed circuit board, an adapter, and a second printed circuit board. The housing has a shape defining a front opening and a first mating structure. The first printed circuit board is located within the housing and has a first plurality of electrical contacts facing the front opening. The adapter is attachable to the device and has a second mating structure that removably engages with the first mating structure of the housing. The second printed circuit board is coupled with the adapter and has a second plurality of electrical contacts exposed on its back surface to electrically connect to the first plurality of electrical contacts when the first mating structure of the housing engages with the second mating structure of the adapter.

20 Claims, 10 Drawing Sheets

Related U.S. Application Data (60) Provisional application No. 62/486,846, filed on Apr. 18, 2017.

(51) Int. Cl.

| | | |
|---|---|---|
| *H01R 31/06* | (2006.01) | |
| *H01R 33/97* | (2006.01) | |
| *H01R 13/622* | (2006.01) | |
| *H05K 5/00* | (2006.01) | |
| *H05K 5/02* | (2006.01) | |
| *H01R 13/639* | (2006.01) | |
| *H05K 1/14* | (2006.01) | |
| *H05K 3/36* | (2006.01) | |
| *H01R 33/945* | (2006.01) | |
| *H05K 5/06* | (2006.01) | |
| *H01R 12/71* | (2011.01) | |
| *H01R 13/74* | (2006.01) | |
| *H01R 33/72* | (2006.01) | |

(52) U.S. Cl.
CPC ....... *H01R 13/6397* (2013.01); *H01R 31/065* (2013.01); *H01R 33/9456* (2013.01); *H01R 33/971* (2013.01); *H05K 1/144* (2013.01); *H05K 3/368* (2013.01); *H05K 5/0052* (2013.01); *H05K 5/0069* (2013.01); *H05K 5/0073* (2013.01); *H05K 5/0247* (2013.01); *H01R 12/707* (2013.01); *H01R 12/714* (2013.01); *H01R 13/748* (2013.01); *H01R 33/72* (2013.01); *H05K 5/069* (2013.01); *H05K 2201/041* (2013.01); *H05K 2201/048* (2013.01); *H05K 2201/10318* (2013.01); *H05K 2201/10356* (2013.01); *H05K 2201/2018* (2013.01)

(58) Field of Classification Search
CPC .............. H01R 31/065; H01R 12/7088; H01R 12/707; H01R 33/72; H01R 13/748; H01R 12/714; H05K 3/368; H05K 1/144; H05K 5/0052; H05K 5/0247; H05K 5/0073; H05K 5/0069; H05K 2201/041; H05K 2201/10356; H05K 2201/10318; H05K 2201/2018; H05K 2201/048; H05K 5/069
See application file for complete search history.

(56) References Cited

U.S. PATENT DOCUMENTS

| | | | |
|---|---|---|---|
| 7,193,644 B2 | 3/2007 | Carter | |
| 7,488,099 B2 * | 2/2009 | Fogg | B60Q 1/2665 359/844 |
| 8,139,098 B2 | 3/2012 | Carter | |
| 8,144,183 B2 | 3/2012 | Carter | |
| 8,154,581 B2 | 4/2012 | Carter | |
| 8,780,201 B1 | 7/2014 | Scalisi et al. | |
| 8,823,795 B1 | 9/2014 | Scalisi et al. | |
| 8,842,180 B1 | 9/2014 | Kasmir et al. | |
| 8,872,915 B1 | 10/2014 | Scalisi et al. | |
| 8,937,659 B1 | 1/2015 | Scalisi et al. | |
| 8,941,736 B1 | 1/2015 | Scalisi | |
| 8,947,530 B1 | 2/2015 | Scalisi | |
| 8,953,040 B1 | 2/2015 | Scalisi et al. | |
| 9,013,575 B2 | 4/2015 | Scalisi | |
| 9,049,352 B2 | 6/2015 | Scalisi et al. | |
| 9,053,622 B2 | 6/2015 | Scalisi | |
| 9,058,738 B1 | 6/2015 | Scalisi | |
| 9,060,103 B2 | 6/2015 | Scalisi | |
| 9,060,104 B2 | 6/2015 | Scalisi | |
| 9,065,987 B2 | 6/2015 | Kasmir et al. | |
| 9,094,584 B2 | 7/2015 | Scalisi et al. | |
| 9,113,051 B1 | 8/2015 | Scalisi | |
| 9,113,052 B1 | 8/2015 | Scalisi et al. | |
| 9,118,819 B1 | 8/2015 | Scalisi et al. | |
| 9,142,214 B2 | 9/2015 | Scalisi | |
| 9,160,987 B1 | 10/2015 | Kasmir et al. | |
| 9,165,444 B2 | 10/2015 | Scalisi | |
| 9,172,920 B1 | 10/2015 | Kasmir et al. | |
| 9,172,921 B1 | 10/2015 | Scalisi et al. | |
| 9,172,922 B1 | 10/2015 | Kasmir et al. | |
| 9,179,107 B1 | 11/2015 | Scalisi et al. | |
| 9,179,108 B1 | 11/2015 | Scalisi et al. | |
| 9,179,109 B1 | 11/2015 | Kasmir et al. | |
| 9,196,133 B2 | 11/2015 | Scalisi et al. | |
| 9,197,867 B1 | 11/2015 | Scalisi et al. | |
| 9,230,424 B1 | 1/2016 | Scalisi et al. | |
| 9,237,318 B2 | 1/2016 | Kasmir et al. | |
| 9,247,219 B2 | 1/2016 | Kasmir et al. | |
| 9,253,455 B1 | 2/2016 | Harrison et al. | |
| 9,342,936 B2 | 5/2016 | Scalisi | |
| 9,508,239 B1 | 11/2016 | Harrison et al. | |
| 9,736,284 B2 | 8/2017 | Scalisi et al. | |
| 9,743,049 B2 | 8/2017 | Scalisi et al. | |
| 9,769,435 B2 | 9/2017 | Scalisi et al. | |
| 9,786,133 B2 | 10/2017 | Harrison et al. | |
| 9,797,562 B2 | 10/2017 | Dabiet et al. | |
| 9,799,183 B2 | 10/2017 | Harrison et al. | |
| 10,444,603 B2 * | 10/2019 | Hsu | F16M 11/14 |
| 2005/0078389 A1 * | 4/2005 | Kulas | B60R 1/04 359/871 |
| 2005/0270621 A1 * | 12/2005 | Bauer | B60R 1/088 359/265 |
| 2008/0009167 A1 | 1/2008 | Hillis et al. | |
| 2009/0086454 A1 | 4/2009 | Sakamoto et al. | |
| 2011/0189877 A1 | 4/2011 | Svelnis et al. | |
| 2011/0216496 A1 | 9/2011 | Benbrahim | |
| 2011/0252897 A1 | 10/2011 | Swenson et al. | |
| 2012/0329294 A1 | 12/2012 | Raybold et al. | |
| 2013/0164567 A1 | 6/2013 | Olsson et al. | |
| 2014/0357094 A1 | 12/2014 | Kim | |
| 2015/0249302 A1 | 9/2015 | Witter et al. | |
| 2016/0375830 A1 * | 12/2016 | Karner | B29C 45/0017 348/148 |
| 2017/0237216 A1 | 8/2017 | Janovec et al. | |
| 2018/0257566 A1 * | 9/2018 | Hamlin | B60R 1/12 |

OTHER PUBLICATIONS

U.S. Appl. No. 15/954,448 Notice of Allowance dated Jan. 28, 2019, 9 pages.

* cited by examiner

MOUNTING ASSEMBLY FOR AN ELECTRICALLY-POWERED DEVICE

RELATED APPLICATIONS

This application is a continuation of U.S. patent application Ser. No. 15/954,448, filed Apr. 16, 2018, which claims priority to U.S. Patent Application Ser. No. 62/486,846, titled "Mounting Assembly for an Electrically-Powered Device," filed Apr. 18, 2017, both of which are incorporated herein in their entireties by reference.

TECHNICAL FIELD

The present embodiments relate to audio/video recording and communication devices, including security camera devices that deter crime and are configured to capture footage of criminal acts when occurring. Certain embodiments may also relate to security lighting systems.

BACKGROUND

Home security is a concern for homeowners and renters. Some exterior lighting systems include motion sensors that activate lights when motion is detected. Existing exterior lighting systems may startle would-be burglars when the lights turn on unexpectedly.

SUMMARY OF THE EMBODIMENTS

One aspect of the present embodiments includes the realization that electrically-powered devices, including audio/video (A/V) recording and communication devices (e.g., security cameras, floodlight controllers with A/V functions, etc.), can sometimes be complicated to install. Such devices may require a direct connection to wall power (AC mains), but many consumers do not have the knowhow to connect an electrically-powered device to wall power. The present embodiments solve this problem by providing a mounting assembly for electrically-powered devices that is easy to use. Embodiments of the present mounting assembly enable electrically-powered devices to be connected to wall power with no more than a simple twisting motion of the electrically-powered device. For example, the present embodiments may include a housing having a front opening. By inserting a mating portion of the electrically-powered device into the front opening and then twisting the electrically-powered device, the device is not only mechanically secured to the mounting assembly but the connection to wall power is simultaneously made as the electrically-powered device is screwed into the housing. The present embodiments thus enable consumers to easily and quickly install electrically-powered devices without needing to directly access, or come in contact with, electrical wiring.

(A1) In a first aspect, a mounting assembly for an electrically-powered device is provided, the mounting assembly comprising a mounting plate, a housing, a first printed circuit board, an adapter, and a second printed circuit board. The mounting plate includes a back surface configured to abut a mounting surface of a supporting structure to which the device is to be mounted, and a front surface opposite the back surface. The housing includes a back cover configured to attach to the front surface of the mounting plate, a first interior surface forming a cavity and a first mating structure, and a front opening. The first printed circuit board is located within the cavity of the housing and has a first plurality of electrical contacts facing the front opening of the housing. The adapter includes an adapter back-end having an exterior surface configured to fit within the front opening and defining a second mating structure configured to engage with the first mating structure, and an adapter front-end defining a front-end interior surface having a forward opening that mechanically couples to the device. The second printed circuit board is located at the adapter back-end and has a second plurality of electrical contacts. The second plurality of electrical contacts abut the first plurality of electrical contacts and the first printed circuit board being electrically coupled to the second printed circuit board when the second mating structure engages with the first mating structure.

(A2) In the mounting assembly denoted by (A1), the forward opening of the adapter may include a ball socket.

(A3) In a mounting assembly denoted by any of (A1) and (A2), the first mating structure of the housing may be a channel. The second mating structure of the adapter may have at least one post extending radially outward from the exterior surface of the adapter and configured to engage with the channel.

(A4) In the mounting assembly denoted by (A3), the at least one post may be a plurality of posts evenly spaced in a circumferential direction about the adapter.

(A5) In the mounting assembly denoted by any of (A3) and (A4), the channel and the at least one post may be configured such that the adapter is rotatable from a disengaged position, with respect to the housing, to a fully engaged position within the front opening of the housing with at most a half turn of the adapter relative to the housing.

(A6) In the mounting assembly denoted by (A5), the adapter may be rotatable from the disengaged position to the fully engaged position with at most a quarter turn of the adapter relative to the housing.

(A7) In the mounting assembly denoted by any of (A1) through (A6), each of the first and second plurality of electrical contacts may include a hot contact, a neutral contact, and a control contact.

(A8) In the mounting assembly denoted by any of (A1) through (A7), at least one of the second plurality of electrical contacts may be a spring contact.

(A9) The mounting assembly denoted by any of (A1) through (A8) may further include a resilient gasket located between the adapter and the housing and contacting each of the adapter and the housing when the first mating structure is engaged with the second mating structure.

(A10) The mounting assembly denoted by any of (A1) through (A9) may further include a plurality of wires each electrically connected to a respective one of the second plurality of electrical contacts and may be extendable toward the forward opening of the adapter for electrically connecting to the device.

(A11) In the mounting assembly denoted by any of (A1) through (A10), the mounting plate may form a plurality of keyhole slots, each of the plurality of keyhole slots may be bounded by a third interior surface of the mounting plate between the front surface and the back surface.

(A12) The mounting assembly denoted by (A11) may further include a plurality of post members protruding from the back cover of the housing, each of the plurality of post members may be configured to engage a respective one of the plurality of keyhole slots to mechanically couple the housing to the mounting plate.

(A13) In the mounting assembly denoted by (A12), each of the plurality of post members may be a screw.

(A14) In the mounting assembly denoted by any of (A1) through (A13), the adapter may further include an annular middle section, between the adapter back-end and the adapter front-end, having an exterior width that exceeds an exterior width of the adapter back-end adjacent to the annular middle section.

(A15) In the mounting assembly denoted by any of (A1) through (A14), the adapter front-end may include a front-end exterior surface opposite the front-end interior surface, the front-end exterior surface and the front-end interior surface forming a slot in the adapter front-end extending from the forward opening toward the adapter back-end.

(A16) The mounting assembly denoted by any of (A1) through (A15), may further include a clamp configured to compress the adapter front-end for mechanically coupling the adapter to the electrically-powered device.

(A17) In the mounting assembly denoted by any of (A1) through (A16), the second plurality of electrical contacts may face the first plurality of electrical contacts when the adapter back-end is at least partially within the front opening of the housing.

(A18) In the mounting assembly denoted by any of (A1) through (A17), the adapter may have a collar with a plurality of grooves in an external surface of the collar, the housing may have a hole therethrough with an axis parallel to an axis of each of the plurality of grooves. Such a mounting assembly may further comprise a security screw configured to anchor the housing with respect to the mounting plate, and having a head configured to seat partially in one of the plurality of grooves to constrain rotation of the adapter within the front opening.

(A19) In the mounting assembly denoted by (A18), the head of the security screw may have a tamper-resistant screw drive selected from the group consisting of bristol, clutch, claw, line, pentalobe, protruding obstacle, spline, TA, TP3, tri-point, tri-grooved, and tri-wing.

(B1) In a second aspect, a mounting assembly for electromechanically connecting an electrically-powered device to a structure is provided, the mounting assembly comprising a housing, a first printed circuit board, an adapter, and a second printed circuit board. The housing has a shape defining a front opening and a first mating structure. The first printed circuit board is located within the housing and has a first plurality of electrical contacts facing the front opening. The adapter is attachable to the device and has a second mating structure that removably engages with the first mating structure of the housing. The second printed circuit board is coupled with the adapter and has a second plurality of electrical contacts exposed on its back surface to electrically connect to the first plurality of electrical contacts when the first mating structure of the housing engages with the second mating structure of the adapter.

(B2) In the mounting assembly denoted by (B1), the first mating structure of the housing may be formed on an interior surface of the front opening.

(B3) In the mounting assembly denoted by any of (B1) and (B2), the adapter may include a ball socket configured to receive a coupling member of the device.

(B4) In the mounting assembly denoted by any of (B1) through (B3), the first mating structure of the housing may be a channel. The second mating structure of the adapter may have at least one post extending radially outward from an exterior surface of the adapter, and configured to engage with the channel.

(B5) In the mounting assembly denoted by (B4), the at least one post may be a plurality of posts evenly spaced in a circumferential direction about the adapter.

(B6) In the mounting assembly denoted by any of (B4) and (B5), the channel and the at least one post may be configured such that the adapter is rotatable from a disengaged position, with respect to the housing, to a fully engaged position within the front opening of the housing with at most a half turn of the adapter relative to the housing.

(B7) In the mounting assembly denoted by (B6), the adapter may be rotatable from the disengaged position to the fully engaged position with at most a quarter turn of the adapter relative to the housing.

(B8) In the mounting assembly denoted by any of (B1) through (B7), each of the first and second plurality of electrical contacts may include a hot contact, a neutral contact, and a control contact.

(B9) In the mounting assembly denoted by any of (B1) through (B8), at least one of the second plurality of electrical contacts may be a spring contact.

(B10) A mounting assembly denoted by any of (B1) through (B9) may further include a resilient gasket located between the adapter and the housing and contacting each of the adapter and the housing when the first mating structure is engaged with the second mating structure.

(B11) In the mounting assembly denoted by any of (B1) through (B10), the adapter may further include: (i) an adapter back-end, an exterior surface thereof configured to fit within the front opening of the housing and defining the second mating structure, (ii) an adapter front-end, a front-end interior surface thereof defining a forward opening configured to mechanically couple to a coupling member of the device, and (iii) an annular middle section, between the adapter back-end and the adapter front-end, having an exterior width that exceeds an exterior width of the adapter back-end adjacent to the annular middle section.

(B12) The mounting assembly denoted by (B11) may further include a plurality of wires each electrically connected to a respective one of the second plurality of electrical contacts and may be extendable toward the forward opening of the adapter for electrically connecting to the device.

(B13) In the mounting assembly denoted by any of (B11) and (B12), the adapter front-end may include a front-end exterior surface opposite the front-end interior surface, the front-end exterior surface and the front-end interior surface forming a slot in the adapter front-end extending from the forward opening toward the adapter back-end.

(B14) A mounting assembly denoted by any of (B1) through (B13) may further include a clamp configured to compress the adapter front-end for mechanically coupling the adapter to the electrically-powered device.

(B15) A mounting assembly denoted by any of (B1) through (B14) may further include a mounting plate having a mounting-plate back surface configured to abut a mounting surface of a supporting structure and a mounting-plate front surface opposite the mounting-plate back surface and configured to attach to the housing.

(B16) In the mounting assembly denoted by (B15), the mounting plate may form a plurality of keyhole slots, each of the plurality of keyhole slots may be bounded by a third interior surface of the mounting plate between the mounting-plate front surface and the mounting-plate back surface.

(B17) In the mounting assembly denoted by (B16), the housing may further include a back cover configured to attach to the mounting-plate front surface. The mounting plate denoted by (B16) may also include a plurality of post members protruding from the back cover. Each of the plurality of post members is configured to engage a respective one of the plurality of keyhole slots to mechanically couple the housing to the mounting plate.

(B18) In the mounting assembly denoted by (B17), each of the plurality of post members may be a screw.

(B19) In the mounting assembly denoted by any of (B1) through (B18), the second plurality of electrical contacts may face the first plurality of electrical contacts when the second mating structure of the adapter engages with the first mating structure of the housing.

(B20) In the mounting assembly denoted by any of (B1) through (B19), the adapter may have a collar with a plurality of grooves in an external surface of the collar, the housing may have a hole therethrough with an axis parallel to an axis of each of the plurality of grooves. Such a mounting assembly may further comprise a security screw having a head configured to seat partially within one of the plurality of grooves to constrain rotation of the adapter with in the front opening.

(B21) In the mounting assembly denoted by (B20), the head of the security screw may have a tamper-resistant screw drive selected from the group consisting of bristol, clutch, claw, line, pentalobe, protruding obstacle, spline, TA, TP3, tri-point, tri-grooved, and tri-wing.

DETAILED DESCRIPTION OF THE EMBODIMENTS

As discussed above, one aspect of the present embodiments includes the realization that electrically-powered devices, including audio/video (A/V) recording and communication devices (e.g., security cameras, floodlight controllers with A/V functions, etc.), can sometimes be complicated to install. Such devices may require a direct connection to wall power (AC mains), but many consumers do not have the knowhow to connect an electrically-powered device to wall power. The present embodiments solve this problem by providing a mounting assembly for electrically-powered devices that is easy to use. Embodiments of the present mounting assembly enable electrically-powered devices to be connected to wall power with no more than a simple twisting motion of the electrically-powered device. For example, the present embodiments may include a housing having a front opening. By inserting a mating portion of the electrically-powered device into the front opening and then twisting the electrically-powered device, the device is not only mechanically secured to the mounting assembly but the connection to wall power is simultaneously made as the electrically-powered device is screwed into the housing. The present embodiments thus enable consumers to easily and quickly install electrically-powered devices without needing to directly access, or come in contact with, electrical wiring.

Figure 1:
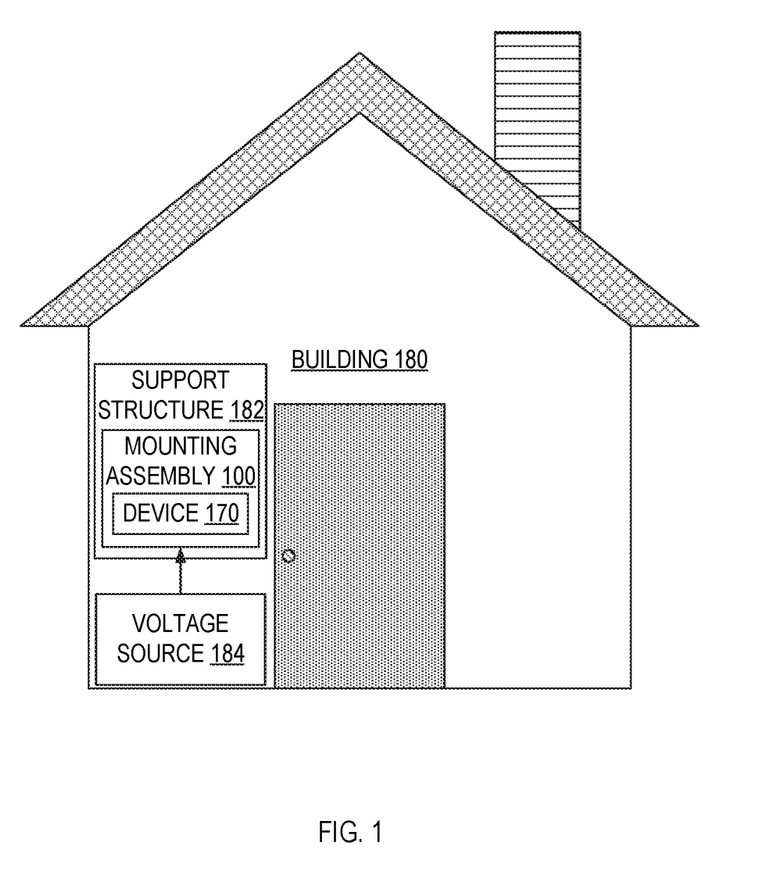
FIG. 1 illustrates an example use scenario for a mounting assembly for an electrically-powered device according to various aspects of the present disclosure.

FIG. 1 illustrates an example use scenario, according to various aspects of the present disclosure, for a mounting assembly 100 for an electrically-powered device 170 outside of a building 180. The building 180 includes a support structure 182. The mounting assembly 100 is attached to the support structure 182 and holds the electrically-powered device 170. The support structure 182 may be part of a wall or a soffit. The electrically-powered device 170 may include, in some embodiments, at least one of a camera, a microphone, and a motion sensor. While the illustrated example of FIG. 1 shows the mounting assembly 100 affixed to the exterior of the support structure 182, the present embodiments include use scenarios in which the mounting assembly 100 is affixed to an interior of a support structure.

With continued reference to FIG. 1, the building 180 includes a voltage source 184, which is electrically connected to the mounting assembly 100. The voltage source 184, for example, provides AC mains electricity associated with a geographic region where the building 180 is located. In some embodiments, the voltage source 184 may be a portable generator or a standby generator.

Figure 2:
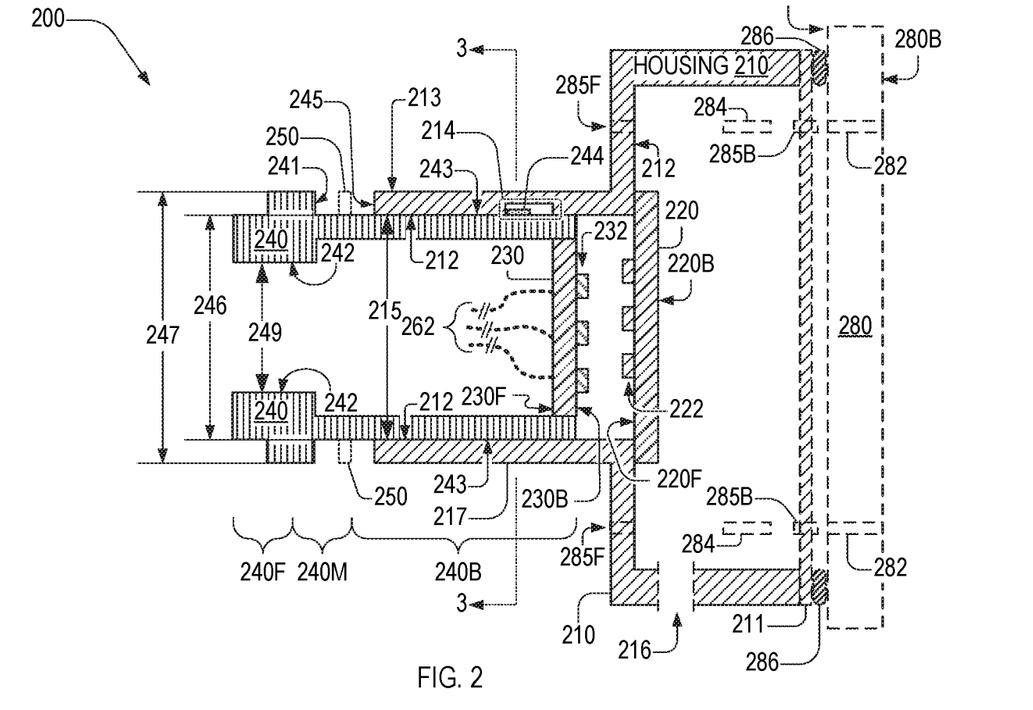
FIG. 2 is a schematic cross-sectional view of a mounting assembly according to various aspects of the present disclosure, including a housing, an adapter, and two printed circuit boards (PCBs); the mounting assembly is an embodiment of the mounting assembly of FIG. 1.
Figure 3:
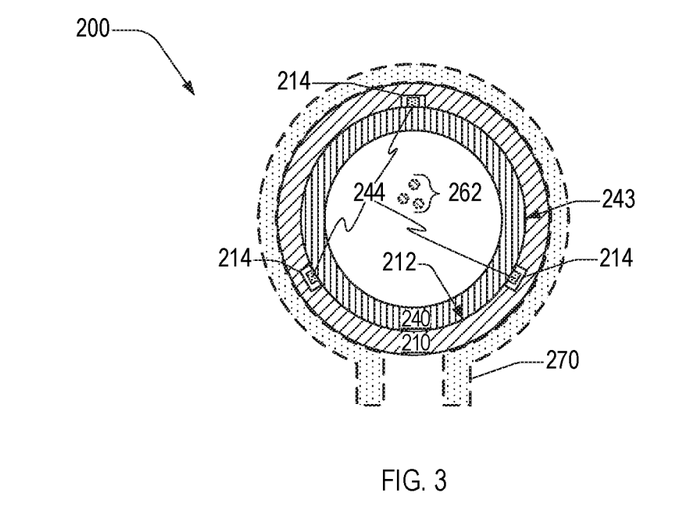
FIG. 3 is a cross-sectional view of the mounting assembly of FIG. 2 taken through the line 3-3 in FIG. 2.

FIG. 2 is a schematic cross-sectional view of a mounting assembly 200, which is an example of the mounting assembly 100 of FIG. 1. FIG. 3 is a cross-sectional view of the mounting assembly 200 taken through the line 3-3 in FIG. 2. FIGS. 2 and 3 are best viewed together in conjunction with the following description. The mounting assembly 200 includes a housing 210, a first printed circuit board (PCB) 220, a second PCB 230, and an adapter 240. The housing 210 has a forward portion 217 defining an interior surface 212 and an exterior surface 213. The interior surface 212 defines a front opening 215. In the illustrated embodiment, the forward portion 217 is substantially cylindrical, but in alternative embodiments the forward portion 217 may have any shape.

The housing 210 also includes at least one mating structure 214, which may be formed on, or may be part of, the interior surface 212. The adapter 240 has an interior surface 242, an exterior surface 243, and defines a front opening 249. The front opening 249 may, in some embodiments, comprise a ball socket, as described in further detail below with respect to FIG. 6. The adapter 240 also includes at least one mating structure 244, which may be formed on, or may be part of, the interior surface 242. The mating structure(s) 244 of the adapter 240 may removably engage the mating structure(s) 214 of the housing 210 to mechanically couple the adapter 240 to the housing 210.

In the illustrated embodiment, the mating structure(s) 214 of the housing 210 comprise a plurality of helical grooves, and the mating structure(s) 244 of the adapter 240 comprise a plurality of posts configured to engage the helical grooves such that as the adapter 240 is rotated in a first direction relative to the housing 210 the adapter 240 advances into the housing 210 and as the adapter 240 is rotated in a second, opposite, direction relative to the housing 210 the adapter 240 withdraws from the housing 210. In alternative embodiments, the mating structure(s) 214, 244 may comprise any other structure configured to mechanically couple the adapter 240 to the housing 210, such as complementary mating threads. Further, while the housing 210 has three mating structures 214 and the adapter 240 has three mating structures 244, the housing 210 and the adapter 240 may have fewer or more mating structures without departing from the scope of the present embodiments. Similarly, while the mating structures 214 and 244 are evenly spaced in the circumferential direction about their respective surfaces 212 and 243, the mating structures 214 and 244 may be unevenly spaced without departing from the scope of the present embodiments. Also, while the mating structures 214 and 244 are female and male, respectively, the mating structures 214 may be male and the mating structures 244 may be female without departing from the scope of the present embodiments.

With reference to FIG. 2, the first PCB 220 is located within the housing 210 and has a first plurality of electrical contacts 222 on a front surface 220F facing the front opening 215. The electrical contacts 222 are configured to electrically connect to the voltage source 184 of the building 180. For example, the first electrical contacts 222 may be electrically coupled to wires (not shown) that are secured (e.g., by soldering) to a back surface 220B of the first PCB 220. The housing 210 may include an aperture 216 configured to receive the wires that are electrically connected to the voltage source 184.

In some embodiments, the wires that extend between the first PCB 220 and the voltage source 184 may comprise a power cord (not shown) having a standard AC wall plug at its distal end (the end opposite the mounting assembly 200).

The power cord may extend through the aperture 216. Electrical power may thus be provided to the mounting assembly 200 by simply plugging the standard AC wall plug into a standard AC wall outlet. In alternative embodiments, the housing 210 may be mounted directly to and/or around a junction box (not shown), and wires may extend between the first PCB 220 and the junction box to provide electrical power to the electrically-powered device 170 (FIG. 1). In such embodiments, the power cord may be omitted.

The second PCB 230 is attached to the adapter 240, has a front surface 230F and a back surface 230B, and has a second plurality of electrical contacts 232 exposed on the back surface 230B. The electrical contacts 232 may also be exposed on the front surface 230F and may extend through the second PCB 230 between the surfaces 230B and 230F.

With continued reference to FIG. 2, the second plurality of electrical contacts 232 may face the first plurality of electrical contacts 222 when the mating structure 244 of the adapter 240 engages with the mating structure 214 of the housing 210. The second electrical contacts 232 may be electrically connected to the first electrical contacts 222 when the second mating structure 244 of the adapter 240 is fully seated within the first mating structure 214 of the housing 210. Each set of the electrical contacts 222, 232 may include a respective hot contact, a respective neutral contact, and a respective control contact, wherein the hot contact of the first electrical contacts 222 engages the hot contact of the second electrical contacts 232, the neutral contact of the first electrical contacts 222 engages the neutral contact of the second electrical contacts 232, and the control contact of the first electrical contacts 222 engages the control contact of the second electrical contacts 232. One or more of the electrical contacts 222, 232 may be a spring contact. The control contacts may be configured to enable control signals to be sent via wires connected to the control contacts so that the electrically-powered device 170 (FIG. 1) may receive and/or send control signals from/to one or more other devices.

As described above, the first mating structure 214 may comprise at least one channel, and the second mating structure 244 may comprise at least one post extending radially outward from the exterior surface 243 of the adapter 240 and configured to engage with the channel(s). The channel(s) and the post(s) may be configured such that the adapter 240 is rotatable from a disengaged position, with respect to the housing 210, to a fully engaged (e.g., fully seated) position within the front opening 215 of the housing 210 with at most a half turn of the adapter 240 relative to the housing 210. For example, the adapter 240 may be rotatable from the disengaged position to the fully engaged position with at most a quarter turn of the adapter 240 relative to the housing 210.

With continued reference to FIG. 2, the adapter 240 includes a back-end 240B, a front-end 240F, and an annular middle section 240M between the back-end 240B and the front-end 240F. The annular middle section 240M has an exterior width 247 that may exceed an exterior width 246 of the adapter back-end adjacent to the annular middle section 240M.

The mounting assembly 200 may include a resilient gasket 250 interposed between the adapter 240 and the housing 210, and more particularly between an annular backside face 241 of the annular middle section 240M and an annular front surface 245 of the housing 210. The resilient gasket 250 is configured to contact, and to be compressed between, each of the annular backside face 241 and the annular front surface 245 when the first mating structure 214 engages with the second mating structure 244 to seal the junction between the adapter 240 and the housing 210 and prevent moisture, e.g., from rain, from reaching the electrical contacts 222 and 232. Such moisture may interfere with operation of a device electrically connected to the electrical contacts 222, e.g., by short-circuiting or by corroding metal components.

The mounting assembly 200 may include a plurality of wires 262, wherein each wire 262 is electrically connected to a respective one of the plurality of electrical contacts 232. Each of the plurality of wires may be extendable toward, and, in some embodiments, through, the front opening 249 of the adapter 240 for electrically connecting to the electrically-powered device 170.

With reference to FIG. 3, the mounting assembly 200 may include a clamp 270 configured to extend around the adapter front-end 240F (FIG. 2) and to compress the adapter front-end 240F around a mating structure (not shown) of the electrically-powered device 170 for mechanically coupling the adapter 240 to the electrically-powered device 170. The clamp 270 may be, for example, a split clamp. For clarity of illustration, the clamp 270 is shown in FIG. 3, and not in FIG. 2.

With reference to FIG. 2, the mounting assembly 200 may include a mounting plate 280, which has a front surface 280F and a back surface 280B. The back surface 280B is configured to abut a mounting surface, such as a wall, of the support structure 182 (FIG. 1). The front surface 280F is opposite the back surface 280B and is configured to attach to the housing 210. The mounting plate 280 may include a plurality of slots 282 that extend through the thickness of the plate 280 between the surfaces 280B, 280F. The slots 282 may be, for example, keyhole slots, though other opening shapes are within the scope of this disclosure.

The mounting assembly 200 may include a back cover 211 configured to attach to the front surface 280F of the mounting plate 280. The back cover 211 may, in some embodiments, be an integral part of the housing 210, or may be a separate piece secured to the housing 210. The housing 210 may also include a plurality of post members 284 protruding outwardly from the back cover 211. Each of the plurality of post members 284 is configured to engage a respective one of the plurality of slots 282 in the mounting plate 280, to mechanically couple the housing 210 to the mounting plate 280. Each post member 284 may be, for example, a fastener, such as a screw, wherein a head of each screw is sized and configured to be releasably received within a respective one of the plurality of slots 282 in the mounting plate 280. The housing 210 may include a plurality of through-holes 285F and 285B that align to the slots 282 such that the post members 284 function to fasten the housing 210 to the mounting plate 280. In one example embodiment, the through-holes 285 are threaded while the slots 282 are not threaded and the post members 284 are screws.

With further reference to FIG. 2, the mounting assembly 200 may also include a seal 286 between back cover 211 and the mounting plate 280. The seal 286 may be annular and may be formed of a resilient material, such as rubber, thermoplastic rubber, silicone, foam, etc.

Figure 4:
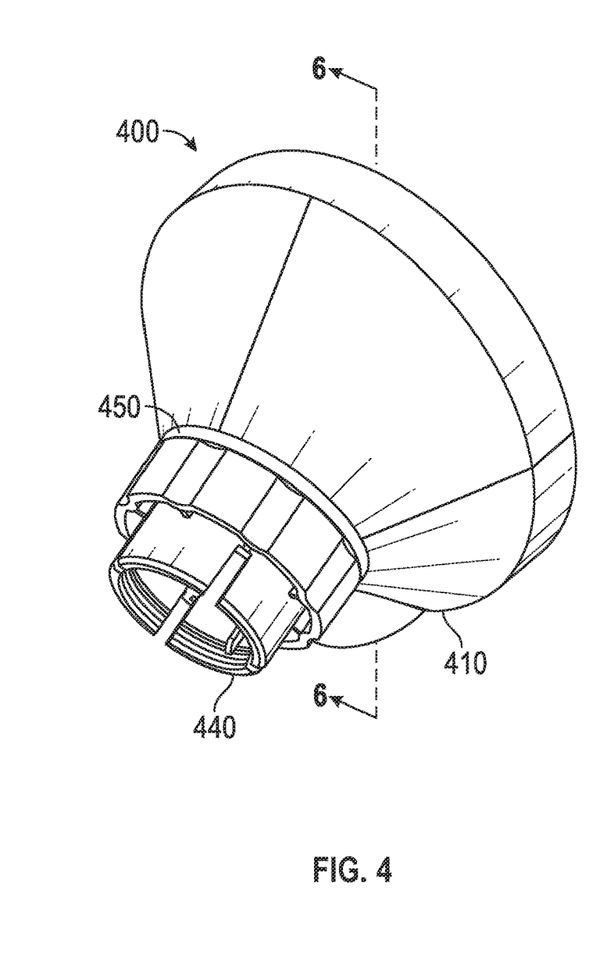
FIG. 4 is an isometric view of a mounting assembly according to various aspects of the present disclosure, which is an example of the mounting assembly of FIG. 2.
Figures 5, 6:
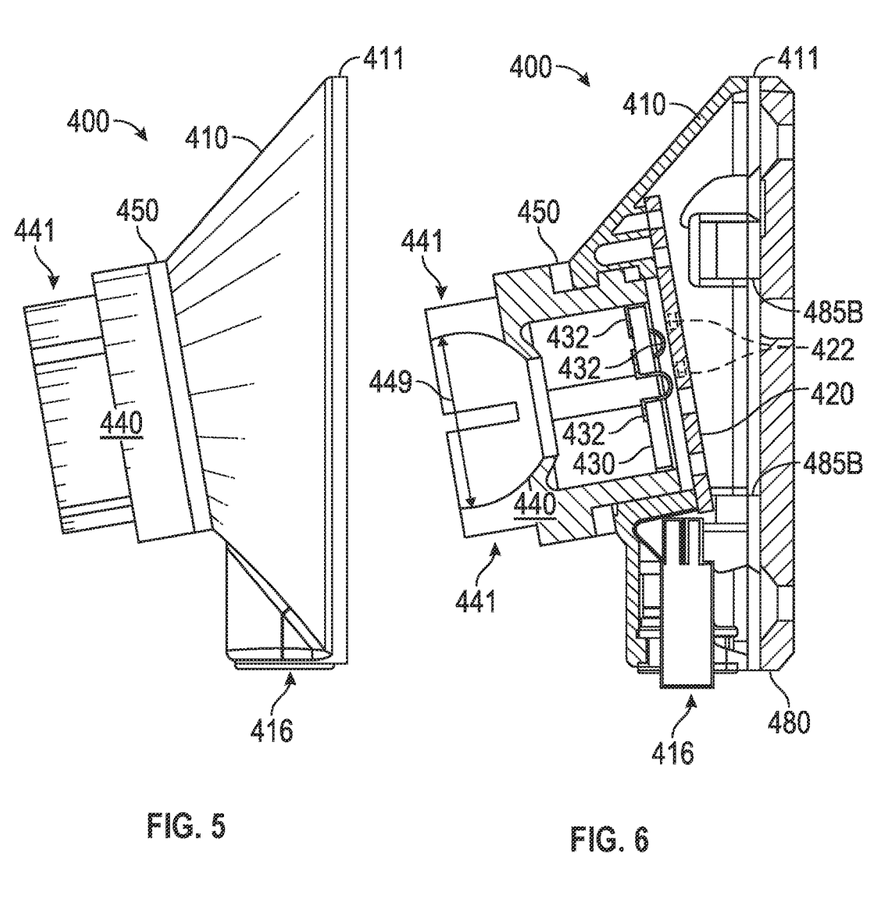
FIG. 5 is a side view of the mounting assembly of FIG. 4.
FIG. 6 is a cross-sectional view of the mounting assembly of FIG. 4 taken through the line 6-6 in FIG. 4.

FIG. 4 is an isometric view of a mounting assembly 400, which is an example of the mounting assembly 200. FIGS. 5 and 6 are, respectively, a side view and a cross-sectional view of the mounting assembly 400. FIGS. 4, 5, and 6 are best viewed together in conjunction with the following description.

The mounting assembly 400 includes a housing 410, a first PCB 420, a second PCB 430, and an adapter 440, which are example embodiments of the housing 210, the first PCB 220, the second PCB 230, and the adapter 240 of the mounting assembly 200 of FIGS. 2 and 3, respectively. The housing 410 may include an aperture 416 configured to receive the wires that are electrically connected to the voltage source 184. The mounting assembly 400 may also include a gasket 450 between the housing 410 and the adapter 440. The gasket 450, which is an example embodiment of the gasket 250, may be formed of a resilient material, such as rubber, thermoplastic rubber, silicone, foam, etc. The adapter 440 includes a ball socket 441 that forms a front opening 449, which is an example embodiment of the front opening 249. The first PCB 420 may be attached to the housing 410, while the second PCB 430 may be attached to the adapter 440.

The first PCB 420 includes a first plurality of electrical contacts 422, illustrated in FIG. 6, which are examples of the first plurality of electrical contacts 222 of FIG. 2. The first electrical contacts 422 are illustrated with dotted lines because they are not in the cross-sectional plane of FIG. 6. The second PCB 430 includes a second plurality of electrical contacts 432, which are examples of the second plurality of electrical contacts 232 of FIG. 2. The electrical contacts 432 may be, for example, leaf-spring contacts or spring loaded contact pins.

In the embodiment illustrated in FIGS. 4-6, the adapter 440 is shown in combination with the housing 410. In some of the present embodiments, however, the adapter 440 may be provided separately from the housing 410. As described above, electrical wires may extend through the adapter 440 between the second electrical contacts 432 on the second PCB 430 and the electrically-powered device that engages the ball socket 441. These wires may be permanently secured to the second electrical contacts 432, such as with solder. To preserve the electrical and physical connection between the wires and the second electrical contacts 432, the adapter 440 may be provided to the end user together with the electrically-powered device. That is, the end user may purchase the electrically-powered device with the adapter 440 pre-secured to the electrically-powered device. The end user may subsequently join the adapter 440 with the mounting assembly 400 by engaging the mating structures of the adapter 440 with the mating structures of the housing 410 and twisting the electrically-powered device with respect to the housing 410 to fully seat with the adapter 440 within the housing 410, substantially as described above with reference to FIGS. 2 and 3. The present embodiments thus enable easy installation, mounting, and electrical connection of any type of electrically powered device (e.g., a security camera, a floodlight controller, a floodlight device, etc.) simply by engaging the adapter 440 with the housing 410 and twisting. In some embodiments, the adapter 440 may be fully seated within the housing 410 with as little as a half-twist (180°) or a quarter-twist (90°).

FIG. 6 further illustrates a back cover 411, including holes 485B, and a mounting plate 480, including a plurality of keyhole slots (not shown) aligned with the holes 485B of the back cover 411.

Figure 7:
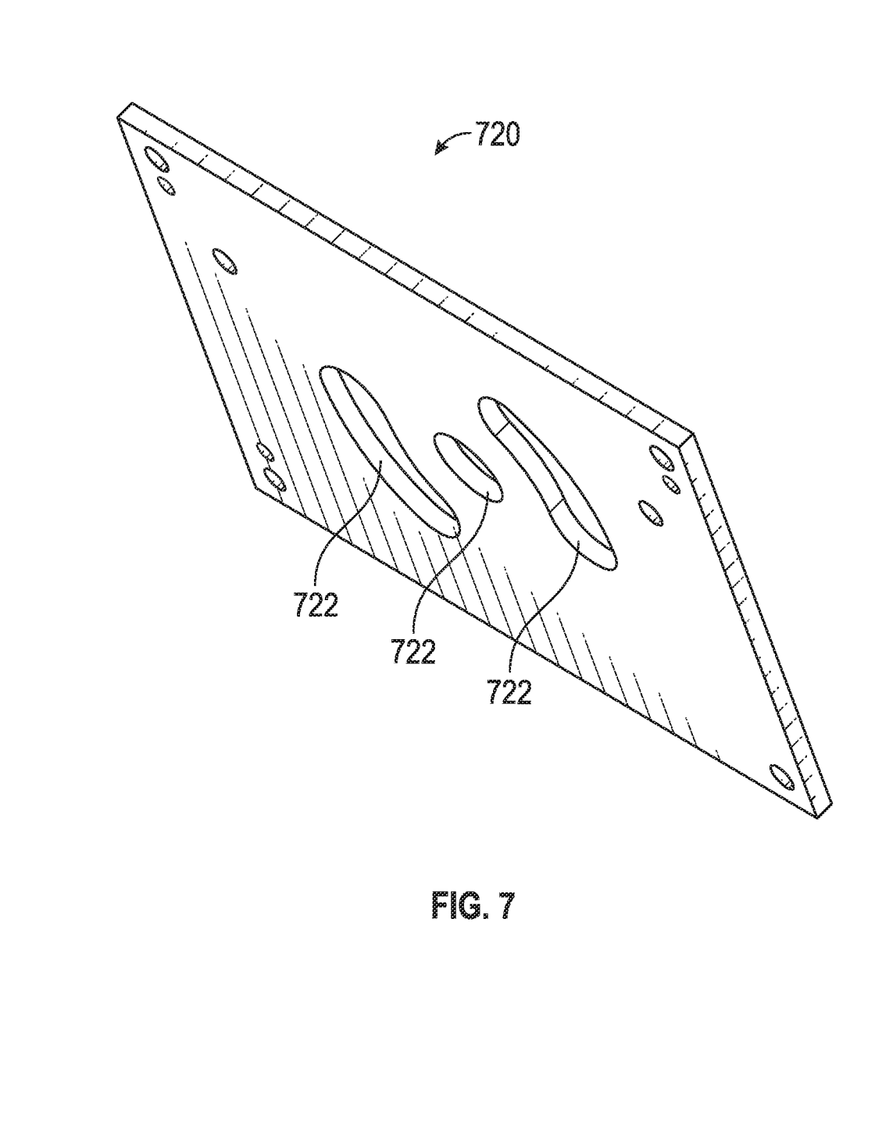
FIG. 7 is a parallel projection view of a first PCB according to various aspects of the present disclosure, which is an example of one of the PCBs of FIG. 2.

FIG. 7 shows a first PCB 720, which is an example embodiment of the first PCBs 420 (FIG. 6) and 220 (FIG. 2). The first PCB 720 includes three first electrical contacts 722, which are example embodiments of the first electrical contacts 422 and 222.

Figure 8:
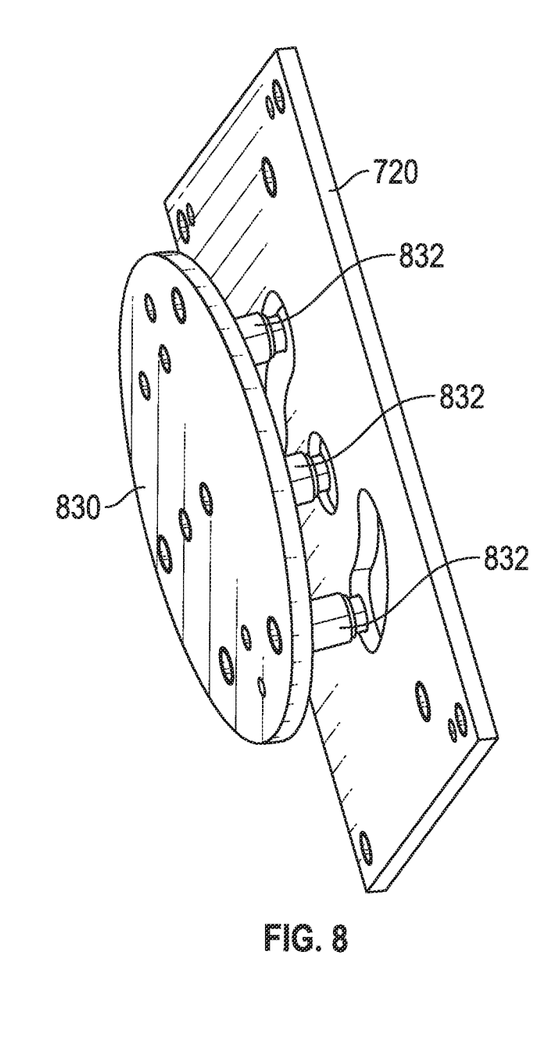
FIG. 8 is a parallel projection view of the PCB of FIG. 7 electrically connected to a second PCB according to various aspects of the present disclosure, which is an example of the PCB of FIG. 2.

FIG. 8 shows the first PCB 720 electrically connected to a second PCB 830, which is an example embodiment of the second PCBs 430 (FIG. 6) and 230 (FIG. 2). The second PCB 830 includes three spring loaded contact pins 832, which are example embodiments of the second electrical contacts 432 and 222.

Figure 9:
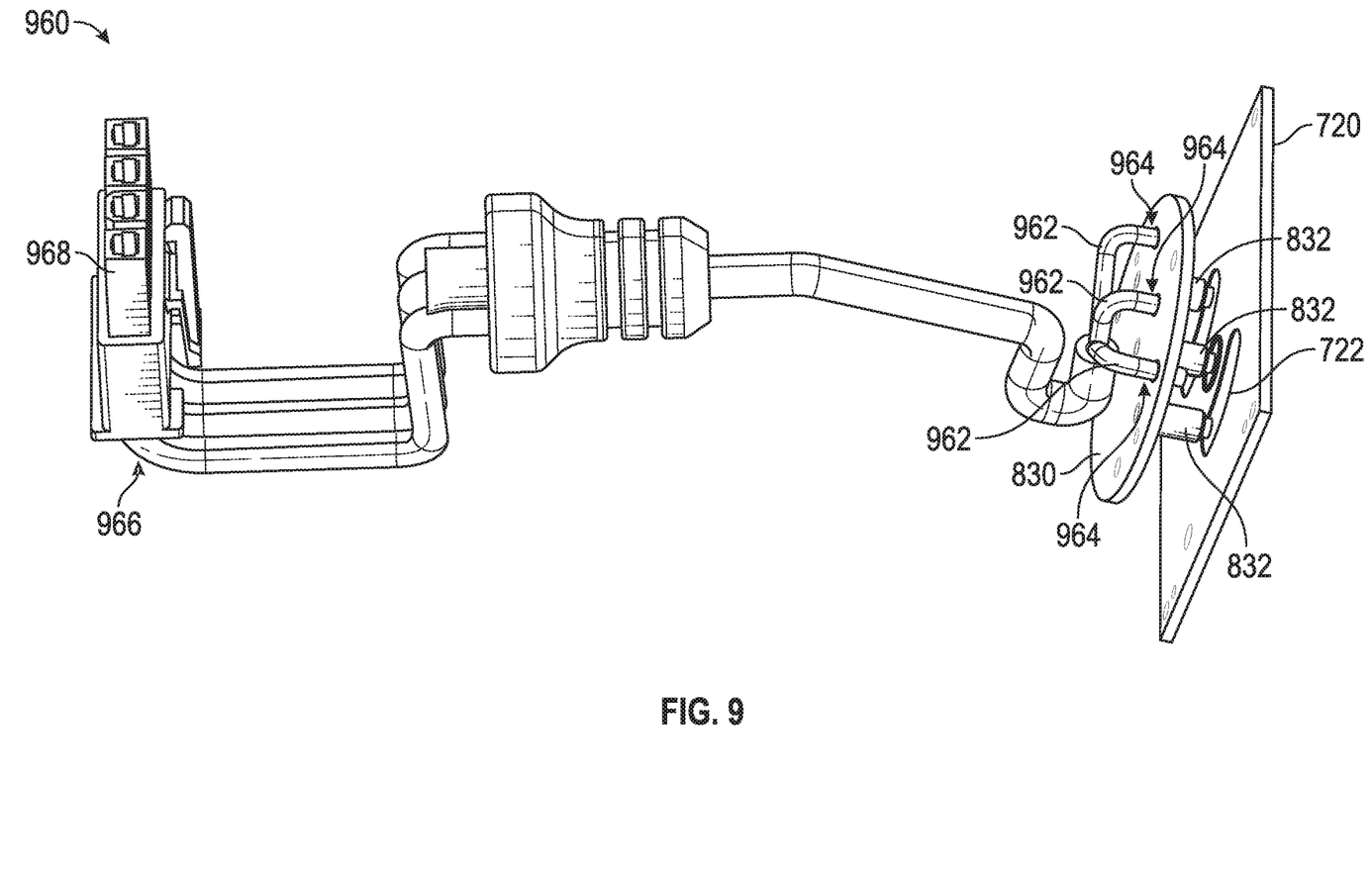
FIG. 9 is a parallel projection view of a power cable according to various aspects of the present disclosure electrically connected to the PCBs of FIG. 7 and FIG. 8.

FIG. 9 illustrates an example embodiment of a power cable 960 electrically connected to the first PCB 720 via the second PCB 830. The power cable 960 includes three wires 962, which are example embodiments of the wires 262 (FIGS. 2 and 3). In this embodiment, a first end 964 of each of the wires 962 is electrically connected to a respective one of the spring loaded contact pins 832, while a second end 966 of each of the wires 962 is mated to a connector 968. The connector 968 may facilitate easy mechanical and electrical connection of the wires 962 to the electrically-powered device.

Figure 10:
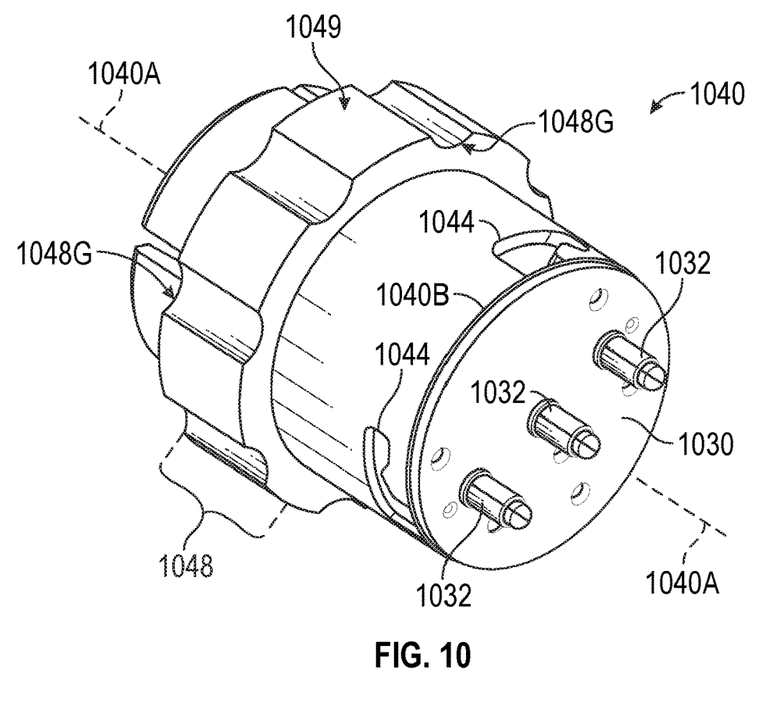
FIG. 10 is a parallel projection view of an adapter with a PCB attached thereto according to various aspects of the present disclosure, which are examples of the adapter and the PCB, respectively, of FIG. 2.

FIG. 10 shows an adapter 1040 and a second PCB 1030 attached at a backend 1040B of the adapter 1040. The adapter 1040 is an example embodiment of the adapters 240 (FIG. 2) and 440 (FIG. 6), and the second PCB 1030 is an example embodiment of the second PCBs 230 (FIG. 2) and 430 (FIG. 6). The adapter 1040 includes a plurality of female mating structures 1044, which are example embodiments of the mating structures 244 (FIGS. 2 and 3). The second PCB 1030 includes a plurality of spring loaded contact pins 1032, which are example embodiments of the spring loaded contact pins 832 (FIG. 8). The adapter 1040 has a collar 1048 having a plurality of grooves 1048G in an external surface 1049. Each of the grooves 1048G extends parallel to a longitudinal axis 1040A of the adapter 1040, and may have a cross-sectional shape corresponding to a portion of a circle.

Figure 11:
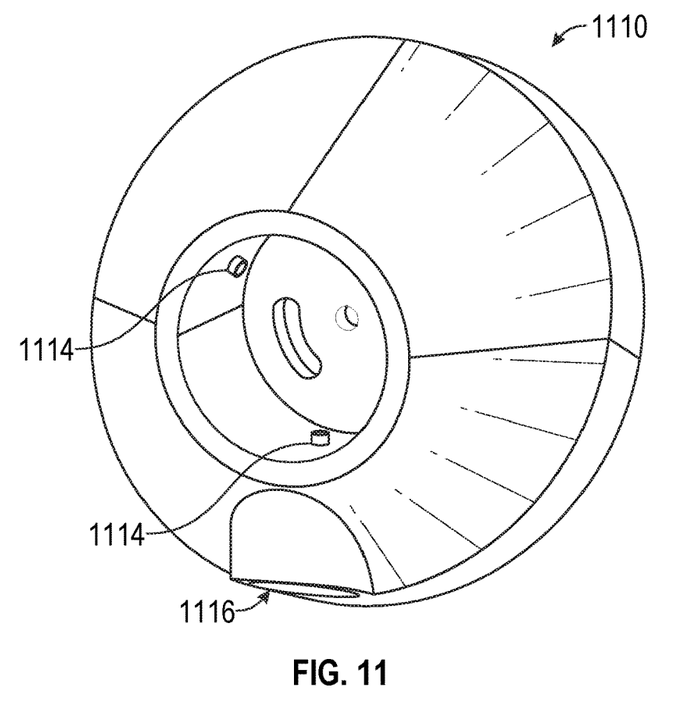
FIG. 11 is a parallel projection view of a housing according to various aspects of the present disclosure, which is an example of the housing of FIG. 2.

FIG. 11 shows a housing 1110, which is configured to mechanically engage with the adapter 1040. The housing 1110 is an example embodiment of the housings 210 (FIG. 2) and 410 (FIG. 6). The housing 1110 includes a plurality of male mating structures 1114, which are example embodiments of the mating structures 214 (FIG. 2). The housing 1110 includes an aperture 1116, which is an example embodiment of the apertures 216 (FIG. 2) and 416 (FIG. 6).

Figure 12:
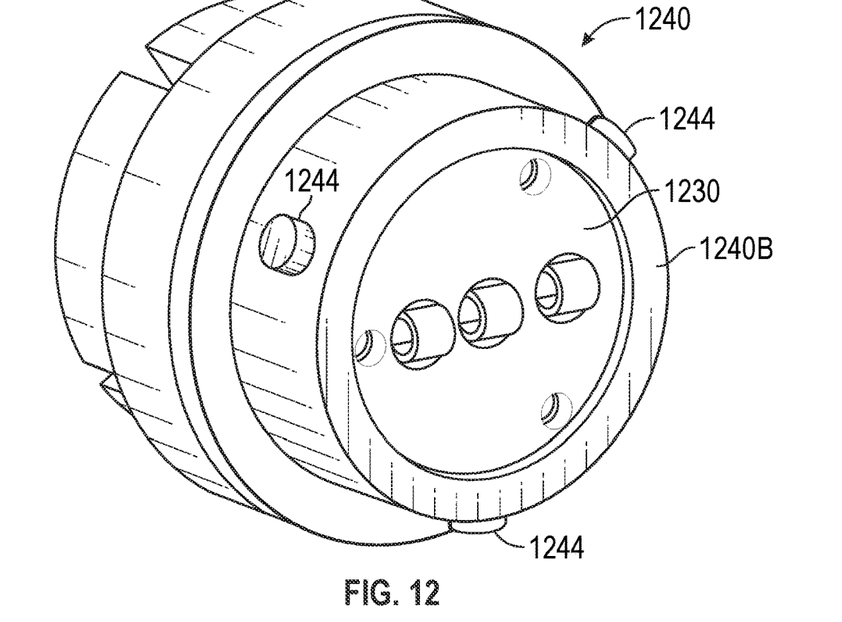
FIG. 12 is a parallel projection view of an adapter with a PCB attached thereto according to various aspects of the present disclosure, which are examples of the adapter and the PCB, respectively, of FIG. 2.

FIG. 12 shows an adapter 1240 and a second PCB 1230 attached at a backend 1240B of the adapter 1240. The adapter 1240 is another example embodiment of the adapters 240 (FIG. 2) and 440 (FIGS. 4-6). The second PCB 1230 is an example embodiment of the second PCBs 230 (FIG. 2) and 430 (FIG. 6). The adapter 1240 includes a plurality of male mating structures 1244, which are example embodiments of the mating structures 244.

Figure 13:
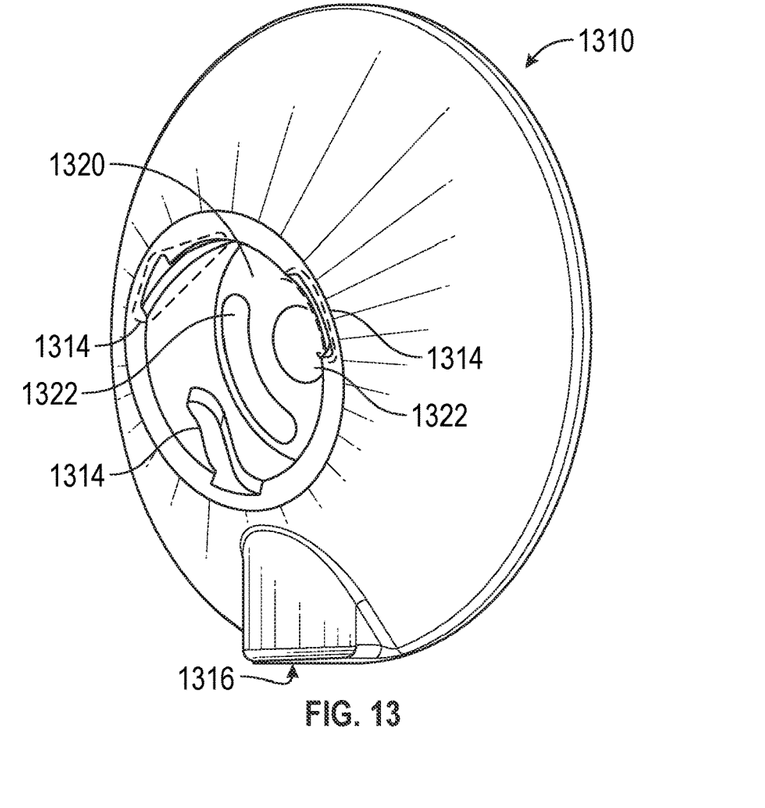
FIG. 13 is a parallel projection view of a housing with a PCB attached thereto according to various aspects of the present disclosure, which are examples of the housing and the PCB, respectively, of FIG. 2.

FIG. 13 shows a housing 1310 and a first PCB 1320 attached thereto. The housing 1310 is configured to mechanically engage with the adapter 1240. The housing 1310 is an example embodiment of the housings 210 (FIG. 2) and 410 (FIGS. 4-6). The first PCB 1320 includes a plurality of first electrical contacts 1322. The first PCB 1320 and the first electrical contacts 1322 are example embodiments of the first PCB 220 and the first electrical contacts 222, respectively (FIG. 2), and the first PCB 420 and the first electrical contacts 422, respectively (FIG. 6). The housing 1310 includes a plurality of female mating structures 1314, which are example embodiments of the mating structures 214 (FIG. 2). The housing 1310 includes an aperture 1316, which is an example embodiment of the apertures 216 (FIG. 2) and 416 (FIG. 6).

Figure 14:
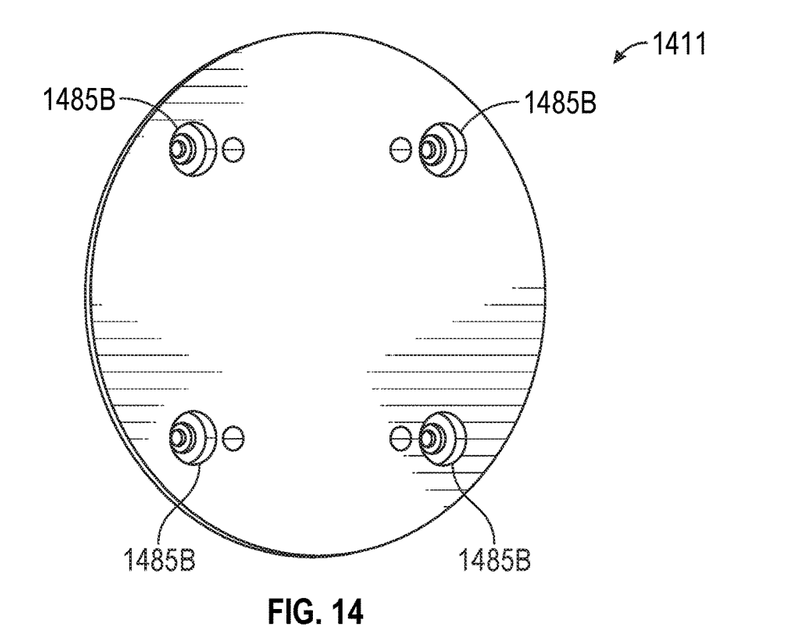
FIG. 14 is a parallel projection view of a back cover of the mounting assembly of FIG. 2 according to various aspects of the present disclosure.

FIG. 14 illustrates a back cover 1411, which is an example embodiment of the back covers 211 (FIG. 2) and 411 (FIG. 6) of the mounting assemblies 200 (FIG. 2) and 400 (FIGS. 4-6). The back cover 1411 includes holes 1485B, which are example embodiments of the through-holes 285B (FIG. 2) and 485B (FIG. 6).

Figure 15:
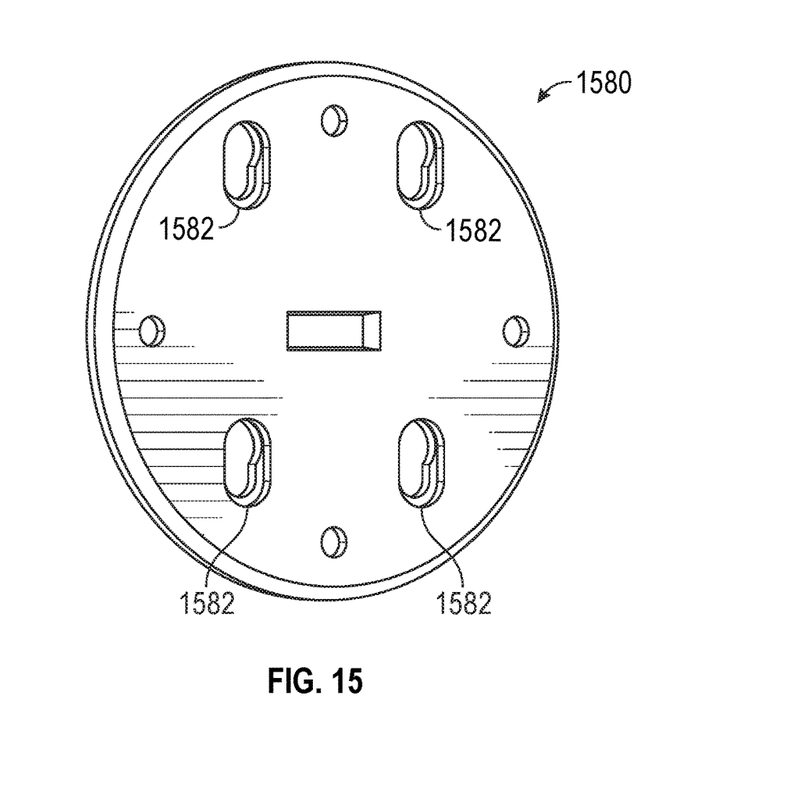
FIG. 15 is a parallel projection view of a mounting plate of the mounting assembly of FIG. 2 according to various aspects of the present disclosure.

FIG. 15 illustrates a mounting plate 1580, which is an example embodiment of the mounting plate 280 of the mounting assembly 200 (FIG. 2) and the mounting plate 480 of the mounting assembly 400 (FIGS. 4-6). The mounting plate 1580 includes a plurality of keyhole slots 1582, which are example embodiments of the slots 282 (FIG. 2). The keyhole slots 1582 are aligned with the holes 1485B of the back cover 1411.

Figure 16:
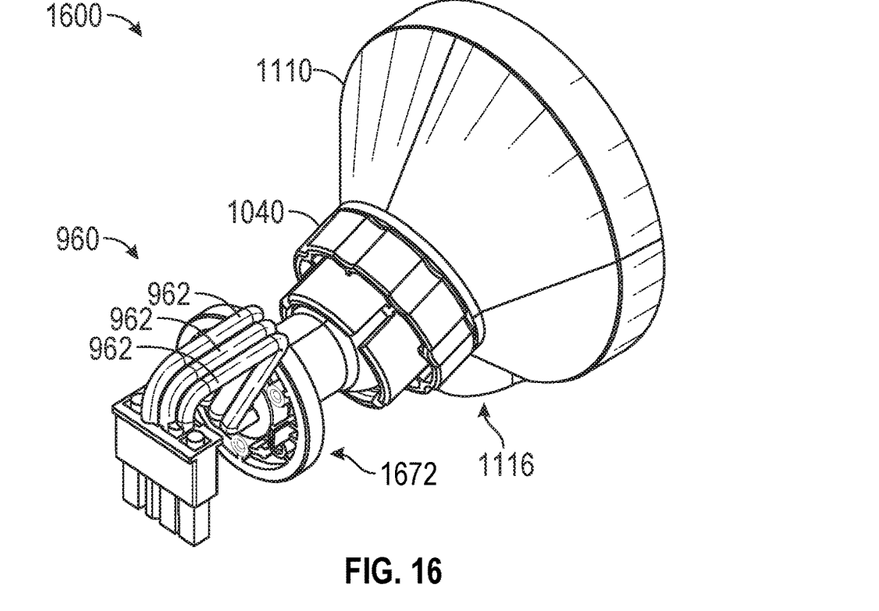
FIG. 16 is an isometric view of a ball stud of the electrically-powered device of FIG. 1 according to various aspects of the present disclosure, which is electrically and mechanically attached to the mounting assembly of FIG. 4.

FIG. 16 is an isometric view of a mounting assembly 1600 attached to a ball stud 1672. The ball stud 1672 may be part of the electrically-powered device 170 (FIG. 1). The mounting assembly 1600 includes the adapter 1040 and the housing 1110 of FIGS. 10 and 11, respectively. When in use, the ball socket 441 of the adapter 1040 holds the ball stud 1672. A clamp (not shown, but may be similar to, or the same as, the clamp of FIG. 3) may extend around the ball socket 441 to compress the ball socket 441 around the ball stud 1672. The power cable 960 extends through the ball stud 1672 and the adapter 1040. When the adapter 1040 is mechanically engaged to the housing 1110, the wires 962 of the power cable 960 electrically connect to a PCB within the housing 1110, such as the PCB 830.

Figure 17:
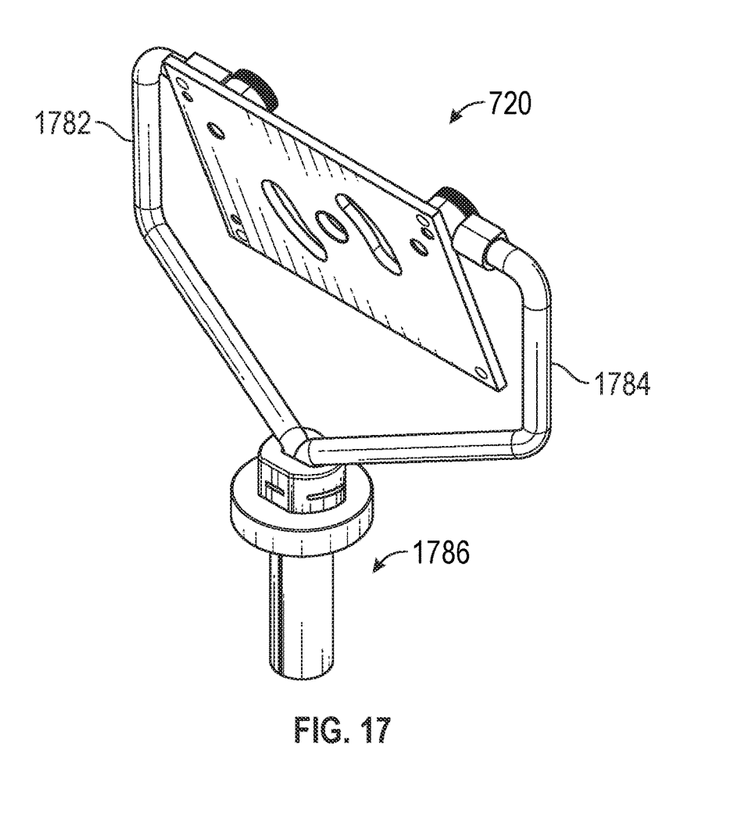
FIG. 17 is an isometric view of the first PCB of FIG. 7 electrically connected to wires configured to carry a supply voltage according to various aspects of the present disclosure.

FIG. 17 is an isometric view of the first PCB 720 (FIG. 7) electrically connected to wires 1782 and 1784, which are held by a cable assembly 1786. The cable assembly 1786 is configured to fit into the aperture 1116 of the housing 1110.

Figures 18, 19, 20:
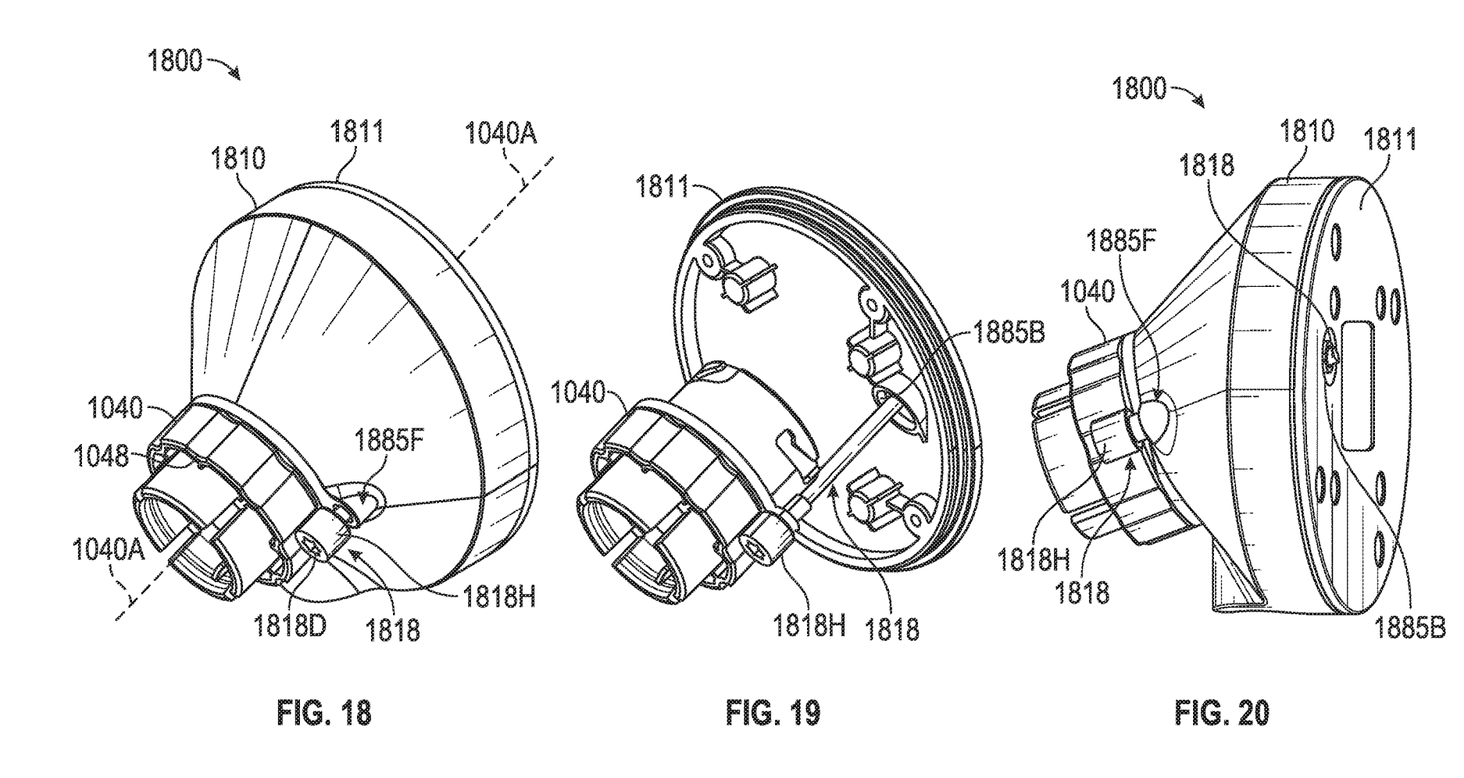
FIG. 18 is an isometric view of the mounting assembly of FIG. 2 with the addition of a security screw, according to various aspects of the present disclosure.
FIG. 19 is an isometric view of the mounting assembly of FIG. 18 with its housing removed.
FIG. 20 is a parallel projection view of the mounting assembly of FIG. 18.

FIG. 18 is an isometric view of a mounting assembly 1800, which includes a housing 1810, the adapter 1040 (FIG. 10), and a security screw 1818. The housing 1810 includes a back cover 1811. FIG. 19 is an isometric view of the adapter 1040, the back cover 1811, and the security screw 1818. FIG. 20 is a parallel projection view of the mounting assembly 1800. FIGS. 18-20 are best viewed together in conjunction with the following description.

The mounting assembly 1800, the housing 1810, and the back cover 1811 are examples of the mounting assembly 200, the housing 210, and the back cover 211, respectively, of FIG. 2. The housing 1810 is similar to the housing 1110 of FIG. 11 and includes a hole 1885F (FIG. 18) for receiving the security screw 1818. An axis of the hole 1885F extends parallel to the longitudinal axis 1040A of the adapter 1040. The back cover 1811 similarly includes a hole 1885B (FIG. 19) for receiving the security screw 1818.

The security screw 1818 has a screw head 1818H. When the security screw 1818 is in the hole 1885F such that the screw head 1818H contacts the housing 1810, the screw head 1818H is also partially within one of the grooves 1048G of the collar 1048 such that the screw head 1818H prevents the adapter 1040 from rotating with respect to the housing 1810. The screw head 1818H has a screw drive 1818D, which may be a tamper-resistant type of screw drive. Non-limiting examples of tamper-resistant screw drives include bristol, clutch, claw, line, pentalobe, protruding obstacle, spline, TA, TP3, tri-point, tri-grooved, and tri-wing. The screw drive 1818D may be a cruciform type, such as square, double square, and triple square. With reference to FIG. 20, the security screw 1818 has sufficient length to protrude from the back cover 1811 and extend into an opening in the mounting plate 280 (FIG. 2) such that it may prevent the housing 1810 from being removed from to the mounting plate 280.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present embodiments, which, as a matter of language, might be said to fall therebetween.

What is claimed is:

1. A mounting assembly for an electrically powered device, comprising:
   a mounting plate configured to abut a mounting surface of a support structure to which the electrically-powered device is to be mounted;
   a ball socket and ball stud configured to provide adjustable mechanical movement of the electrically powered device relative to the mounting plate;
   an adapter coupled with the ball socket to couple the ball socket and ball stud to the mounting plate;
   a printed circuit board having a plurality of electrical contacts, the printed circuit board being immovable, relative to the mounting plate, during the adjustable mechanical movement; and
   a power cable electrically coupled with the printed circuit board.

2. The mounting assembly of claim 1, the power cable extending through the ball stud.

3. The mounting assembly of claim 1, the power cable comprising a connector at an end opposite the printed circuit board.

4. The mounting assembly of claim 3, the power cable for delivering electrical power from an electrical source to electronics of the electrically powered device.

5. The mounting assembly of claim 1, further comprising a housing around the mounting plate, the housing defining an aperture.

6. The mounting assembly of claim 5, further comprising a power cord electrically coupled to at least one of the plurality of contacts and extending through the aperture.

7. The mounting assembly of claim 1, the adapter being configured to releasably couple the ball socket and ball stud to the mounting plate.

8. A mounting assembly for an electrically-powered device, comprising:
   a mounting plate configured to abut a mounting surface of a support structure to which the electrically-powered device is to be mounted;
   a ball socket and ball stud providing adjustable mechanical movement of the electrically-powered device relative to the mounting plate;
   a printed circuit board having at least one electrical contact for receiving electrical power through the mounting plate and from an electrical source, the at least one electrical contact being immovable, relative to the mounting plate, during the adjustable mechanical movement; and
   a power cable passing through the ball socket and the ball stud and electrically coupling with the at least one electrical contact.

9. The mounting assembly of claim 8, further comprising a housing around the mounting plate and defining a power cord aperture.

10. The mounting assembly of claim 9, the power cord aperture being configured for passage of a power cord that electrically connects to the at least one contact.

11. The mounting assembly of claim 9, further comprising an adapter that releasably couples with a front opening of the housing to mechanically support the electrical device through the ball socket and the ball stud.

12. The mounting assembly of claim 11, further comprising at least one additional electrical contact within the front opening to connect with the at least one electrical contact.

13. The mounting assembly of claim 8, the power cable extending between the ball stud and the electronic device.

14. The mounting assembly of claim 8, the power cable comprising a connector at an end opposite the printed circuit board.

15. A mounting assembly for an electrically-powered device, comprising:
   a mounting plate configured to abut a mounting surface of a support structure to which the electrically-powered device is to be mounted;
   a ball socket and ball stud;
   a printed circuit board having at least one electrical contact that is immovable during adjustable mechanical movement of the electrically-powered device relative to the mounting plate; and
   a power cable electrically connecting the at least one electrical contact and the electrically-powered device.

16. The mounting assembly of claim 15, further comprising a housing around the mounting plate and defining a power cord aperture.

17. The mounting assembly of claim 16, further comprising a power cord electrically coupling the at least one contact to an external power source via the aperture.

18. The mounting assembly of claim 16, further comprising an adapter releasably coupling with a front opening of the housing and supporting the ball socket and the ball stud.

19. The mounting assembly of claim 15, the printed circuit board being immovable during adjustment of the ball stem and ball socket.

20. The mounting assembly of claim 15, the power cable comprising a connector at an end opposite the printed circuit board.

* * * * *